US012713947B2

(12) United States Patent
Lai et al.

(10) Patent No.: US 12,713,947 B2
(45) Date of Patent: Aug. 18, 2026

(54) VIA ARRAY IN A REDISTRIBUTION LAYER STRUCTURE FOR STRESS RELIEF

(71) Applicant: Taiwan Semiconductor Manufacturing Company, Ltd., Hsin-Chu (TW)

(72) Inventors: Yu-Chung Lai, Taichung City (TW); Ying-Yao Lai, Taichung City (TW); Chen-Chiu Huang, Taichung City (TW); Hsiang-Ku Shen, Hsinchu City (TW); Dian-Hau Chen, Hsinchu (TW); Kuo-An Liu, Hsinchu City (TW); Tzu-Ting Liu, Taoyuan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 468 days.

(21) Appl. No.: 18/347,848

(22) Filed: Jul. 6, 2023

(65) Prior Publication Data

US 2025/0015007 A1 Jan. 9, 2025

(51) Int. Cl.
*H10W 70/60* (2026.01)
*H10W 20/20* (2026.01)
(Continued)

(52) U.S. Cl.
CPC ......... *H10W 70/614* (2026.01); *H10W 20/20* (2026.01); *H10W 42/121* (2026.01);
(Continued)

(58) Field of Classification Search
CPC ............... H01L 23/5389; H01L 23/481; H01L 23/49838; H01L 23/562; H01L 24/08;
(Continued)

(56) References Cited

U.S. PATENT DOCUMENTS

2006/0208360 A1* 9/2006 Yiu ........................ H01L 24/03 257/750
2010/0283148 A1* 11/2010 Tsai ...................... H10W 20/20 257/737
(Continued)

FOREIGN PATENT DOCUMENTS

TW 202308097 A 2/2023

*Primary Examiner* — Benjamin Tzu-Hung Liu
(74) *Attorney, Agent, or Firm* — HAYNES AND BOONE, LLP

(57) ABSTRACT

One aspect of the present disclosure pertains to an integrated (IC) structure. The IC structure includes a semiconductor substrate; an interconnect structure formed over the substrate; and a redistribution layer (RDL) structure formed over the interconnect structure. The RDL structure includes: a RDL pad portion having a pad via array with multiple vias landing on a first top metal line of the interconnect structure; a RDL signal routing portion having a signal routing via landing on a second top metal line of the interconnect structure; and a RDL top portion over the RDL pad portion and the RDL signal routing portion. The multiple vias of the pad via array include a block via and an adjacent sacrificial via, the block via having a block via width, the sacrificial via having a sacrificial via width, and the block via width is greater than the sacrificial via width.

20 Claims, 9 Drawing Sheets

(51) Int. Cl.
*H10W 42/00* (2026.01)
*H10W 70/65* (2026.01)
*H10W 72/00* (2026.01)
*H10W 72/30* (2026.01)
*H10W 72/90* (2026.01)
*H10W 80/00* (2026.01)
*H10W 90/00* (2026.01)

(52) U.S. Cl.
CPC ......... *H10W 70/65* (2026.01); *H10W 72/851* (2026.01); *H10W 72/07353* (2026.01); *H10W 72/332* (2026.01); *H10W 72/932* (2026.01); *H10W 80/721* (2026.01); *H10W 80/732* (2026.01); *H10W 90/734* (2026.01)

(58) Field of Classification Search
CPC . H01L 24/32; H01L 24/73; H01L 2224/0801; H01L 2224/08056; H01L 2224/32054; H01L 2224/32235; H01L 2924/01022; H01L 2924/01073; H10W 70/614; H10W 20/20; H10W 42/121; H10W 70/65; H10W 72/851; H10W 72/07353; H10W 72/332; H10W 72/932; H10W 80/721; H10W 80/732; H10W 90/734
See application file for complete search history.

(56) References Cited

U.S. PATENT DOCUMENTS

2012/0248623 A1* 10/2012 Li ..................... H01L 21/76877
257/774
2020/0118977 A1 4/2020 Lu et al.

* cited by examiner

140
W2
e1
e2
e2
L2
140c
150
d2
140b
N1 rows
N2 rows
148
M1 columns
d1
e1
V2
d1
149
e1
V2
d1
V1
d1
V2
e1
V1
L1
140a
M2 columns
d1
d1
V2
e1
W1
x
y

VIA ARRAY IN A REDISTRIBUTION LAYER STRUCTURE FOR STRESS RELIEF

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Many of the technological advances have occurred in the field of IC packaging, which may involve chip bonding and the rerouting of I/O signals to different locations on an IC chip. To that effect, a metal redistribution layer (RDL) is often used to reroute connections from a lower level (e.g., interconnects and device regions) to desired bond-out locations for better access to bond pads where necessary. The RDL may also be used to spread contact points around a die to alleviate the thermal stress of mounting. However, when a larger bulk metal RDL pad is formed together with a smaller and thinner via (such as through a damascene process), metal filling issues may occur in the smaller via. The metal filling issues can be caused by stresses due to differences in the thermal expansion coefficients of the metal (e.g., copper) and surrounding dielectric materials. Specifically, the stress gradient in the via bottom area changes, creating defects and vacancies in the via portions of the metal RDL. Additionally, larger bulk metal will drive more vacancies, and the stress gradient leads to vacancy aggregation and void nucleation to balance the stress in the metal, decreasing component reliability. Even further, the thermal expansion stress of the larger bulk metal portion will pull the via portions upwards, causing pull back break and disconnecting the component.

Therefore, while existing methods and structures related to RDL structures are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
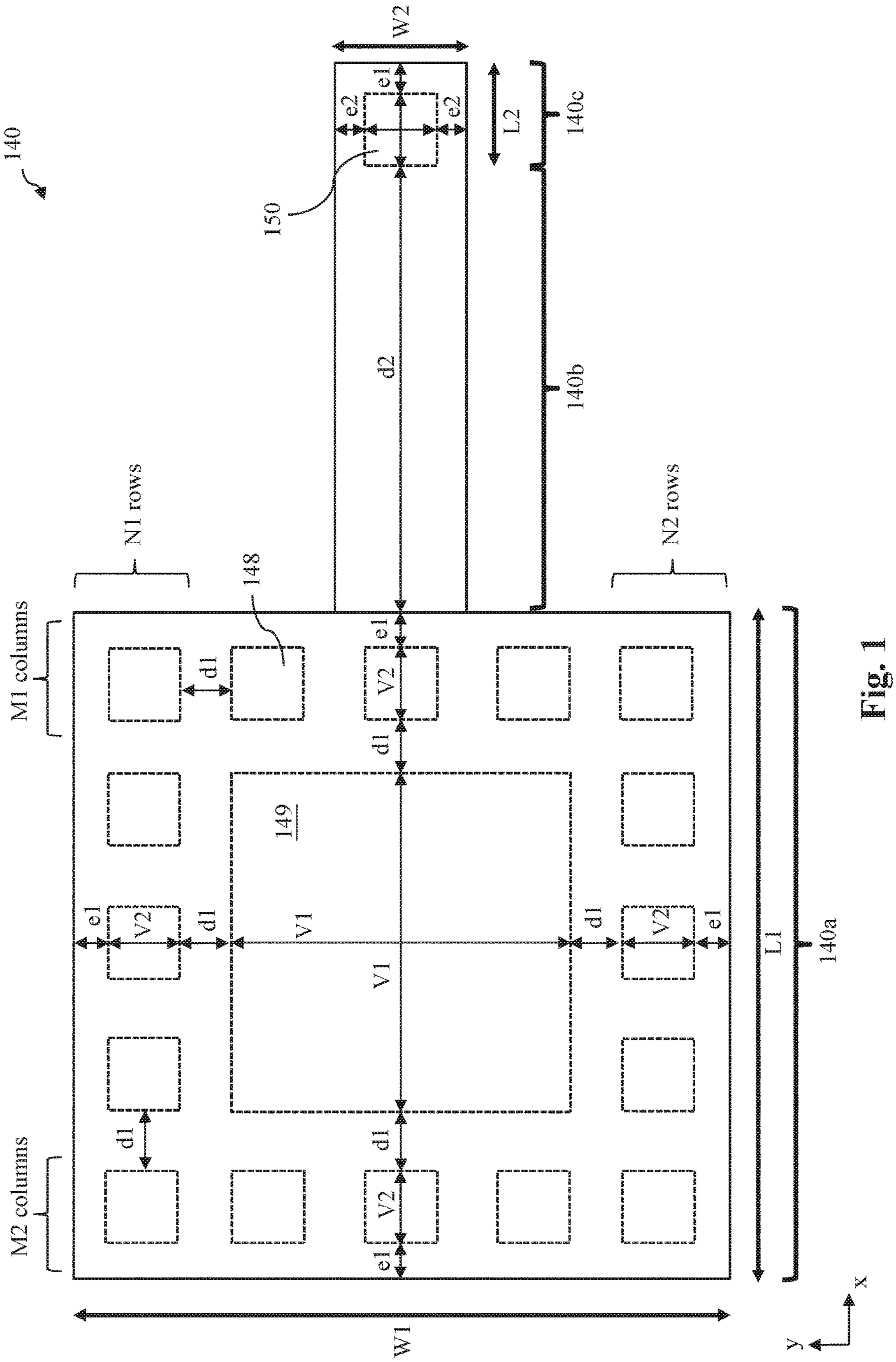
FIG. 1 illustrates a redistribution layer (RDL) structure having a via array according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “under,” “above,” “upper,” “over” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with “about,” “approximate,” and the like, the term is intended to encompass numbers that are within a reasonable range including the number described, such as within +/−10% of the number described, or other values as understood by person skilled in the art. For example, the term “about 5 nm” may encompass the dimension range from 4.5 nm to 5.5 nm. And when comparing a dimension or size of a feature to another feature, the phrases “substantially the same,” “essentially the same,” “of similar size,” and the like, are understood to be within +/−10% between the compared features.

The present disclosure relates to different embodiments of a redistribution layer (RDL) structure in an integrated circuit (IC). The RDL structure has a bond pad portion and a signal routing portion connected together by a top portion of the RDL structure. The bond pad portion includes a via array having multiple vias, and the signal routing portion includes a signal routing via routing to signal lines below. The bond pad portion is bigger than the signal routing portion. However, since the bond pad portion (and the top portion above it) includes a larger amount of bulk metal, there is risk of defects and vacancies due to bulk metal pull back on the signal routing via. As such, the present disclosure incorporates a via array in the bond pad portion. The via array will attract vacancy accumulation and void nucleation in the bond pad portion, thereby reducing or eliminating the via pullback on the signal routing via in the signal routing portion. In other words, the via array absorbs any stress-caused voiding and defects in place of the signal routing via. This prevents the signal routing via from breaking off and causing an open circuit along a signal path.

FIG. 1 illustrates a redistribution layer (RDL) structure 140 having a via array according to an embodiment of the present disclosure. FIG. 1 shows the RDL structure 140 in a top view. As shown, the RDL structure 140 includes a bond pad portion **140*a* having an area defined by the dimensions L1 and W1. The bond pad portion 140*a* may be rectangular shaped where L1 is different from W1. Alternatively, as shown, the bond pad portion 140*a* may be square shaped, where L1 equals W1. In other words, a width or length of the bond pad portion 140*a* along the x direction is equal to a width or length of the bond pad portion 140*a* along the y direction. In an embodiment, L1 and W1 is in a range between 30-50 μm. In an embodiment, L1 and W1 are both about 50 μm. The bond pad portion 140*a* includes a via array having a block via 149 and multiple sacrificial vias 148 surrounding the block via 149. The block via 149 has a dimension V1 along the x direction and the y direction, and each of the sacrificial vias 148 has a dimension V2 along the x direction and the y direction. The dimension V1 is greater than the dimension V2. In an embodiment, a ratio of V1 to V2 is greater than 12. In an embodiment, the dimension V1 is about 40 μm and the dimension V2 is about 2.7 μm. In an embodiment, the dimension V2 is in a range between 1-3 μm. Note that the block via 149 cannot be too large, where V1 approaches L1 or W1. If this is the case, there would not be enough space for the sacrificial vias 148 for the desired stress relieving effect and the block via 149 will incur excess pullback force on the signal routing via 150. Therefore, a ratio of L1 to V1 and/or W1 to V1 should be greater than 1.1. In an embodiment, the ratio of L1 to V1 is about 1.25. Still referring to FIG. 1, the bond pad portion 140*a* includes a spacing d1 between each adjacent sacrificial vias 148 and between the block via 149 and the sacrificial vias 148. In an embodiment, the spacing d1 is in a range between 1.6-2 μm. In an embodiment, the spacing d1 is 1.8 μm. Still referring to FIG. 1, the bond pad portion 140*a* includes an edge spacing e1 between outer edges of the bond pad portion 140*a* and outer edges of the sacrificial vias 148. In an embodiment, the edge spacing e1 is in a range between 0.25 to 0.65 μm. In an embodiment, the spacing e1 is about 0.65 μm. As shown in FIG. 1**, the dimension L1 or W1=2(e1+V2+d1)+V1. In an embodiment, L1 or W1=2(0.65+2.7+1.8)+39.7=50 μm.

Still referring to FIG. 1, the RDL structure 140 further includes a signal routing portion **140*c* defined by the dimensions L2 and W2. The signal routing portion 140*c* includes a signal routing via 150 spaced away from edge portions (i.e., e1 and e2) of the signal routing portion 140*c*. In an embodiment, the signal routing via 150 has the same dimensions as the sacrificial vias 148 (e.g., having dimensions V2). In another embodiment, the signal routing via 150 has a greater dimension than the dimension V2. In any case, the signal routing via 150 may have similar dimensions as the sacrificial vias 148, but as will be explained in more detail below, the signal routing via 150 routes signal lines and has a different function than the sacrificial vias 148. The dimension L2 is along the x direction and includes the dimension of the signal routing via 150 and an edge spacing e1. The dimension W2 is along the y direction and includes the dimension of the signal routing via 150 and two edge spacings e2. The signal routing via 150 is spaced away from edge portions of the signal routing portion 140*c* by the edge spacing e2 along the y direction and spaced away from the edge portion of the signal routing portion 140*c*** by the edge spacing e1 (described above) along the x direction. In an embodiment, W2 is in a range between 1.5-4 μm. In an embodiment, W2 is about 3.6 μm. In an embodiment, e2 is greater than e1. This is because e2 is defined by the dimension W2, which may be greater than the dimension V2 by an amount such that e2 is greater than e1. For example, e1=0.65 (described above), e2=0.9, and V2=2.7, and where W2=2*e2+V2 so W2=2*0.9+2.7=3.6 μm.

Still referring to FIG. 1, the RDL structure 140 further includes a connecting portion **140*b* having an area defined by the dimensions d2 and W2. The connecting portion 140*b* connects the signal routing via 150 to the sacrificial and block vias 148 and 149. The dimension W2 (described above) is also the width of the connecting portion 140*b* along the y direction, and the dimension d2 is a length of the connecting portion 140*b* between the bond pad portion 140*a* and the signal routing portion 140*c* along the x direction. The dimension W2 may also be referred to as the RDL line width. Referring to the dimension W1 as the RDL pad width (i.e., width of the bond pad portion 140*a*), the RDL pad width is greater than the RDL line width. In other words, W1 is greater than W2. In an embodiment, W1 is greater than W2 by at least 7 times. In an embodiment, a ratio of W1 to W2 is in a range between 7 to 35. W1 should be greater than W2 due to the RDL bond pad portion 140*a* acting as an external metal block for rerouting signals to outside bond pads. Due to the significant difference in size between W1 and W2 (in some embodiments, just the block via itself has a dimension V1 is greater than W2), the sacrificial vias 148 as described are needed to alleviate stress and reduce metal pullback effect on the signal routing via 150. In an embodiment, the dimension V1/W2 is in a range between 2 to 6. Still referring to FIG. 1, the dimension d2 may also be referred to as the RDL line length. In an embodiment, the dimension d2 (RDL line length) is greater than 3 times the dimension V2 (sacrificial or signal routing via width). In an embodiment, the dimension d2 is about 10 μm. Since the dimension d2 is the line length that reroutes via connections in different portions of the RDL structure 140, it should also be greater than the dimension d1 (spacing between vias within the bond pad portion 140*a***). In an embodiment, the ratio of d2 to d1 is greater than 5.

Still referring to FIG. 1, there may be M1 and M2 columns of sacrificial vias 148 lining opposing sides of the block via 149 along the y direction. There may be N1 and N2 rows of sacrificial vias 148 lining opposing sides of the block via 149 along the x direction. In the embodiment shown, M1, M2, N1, and N2 all equal 1. In other words, one layer of sacrificial vias 148 surround all four sides of the block via 149. Since there is only one layer of sacrificial vias 148, the sacrificial vias 148 in this layer may also be referred to as perimeter vias 148. In further embodiments, M1, M2, N1, and N2 all equal 2 or more. In this case, additional layers of sacrificial vias 148 surround all four sides of the block via 149. The additional layers may cause additional stress relieving effect according to design considerations.

Figure 2:
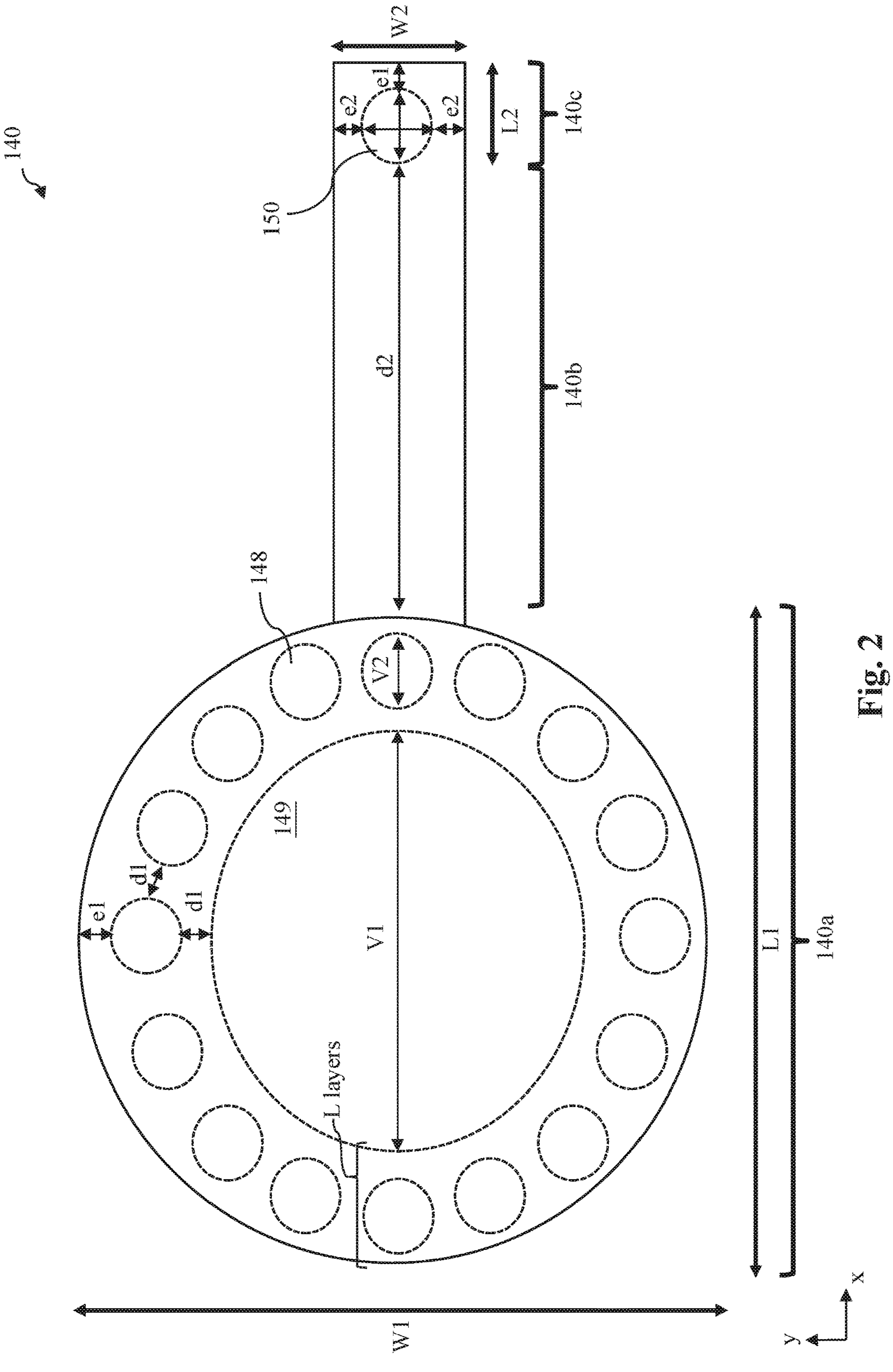
FIG. 2 illustrate a RDL structure having a via array according to another embodiment of the present disclosure.

FIG. 2 illustrate a RDL structure 140 having a via array according to another embodiment of the present disclosure. The RDL structure 140 in FIG. 2 is similar to the one shown in FIG. 1, and the similar aspects can be equally applied here. The difference is that the bonding pad portion 140*a* may be circular shaped (as shown) having a circular block via 149 and multiple circular sacrificial vias 148. Further, the signal routing via 150 may also be circular shaped. The spacing between vias in the bonding pad portion 140*a* is d1, like described above with respect to FIG. 1. The block via 149 may have a dimension V1, like described above with respect to FIG. 1. And the sacrificial vias 148 and the signal routing via 150 may have a dimension V2, like described above with respect to FIG. 1. Other similar features to FIG. 1 are not described again for the sake of brevity.

Still referring to FIG. 2, there may be L layers of sacrificial vias 148 surrounding the perimeter of the circular block via 149. In the embodiment shown, L equals 1. In other words, one layer of sacrificial vias 148 surround the block via 149. Since there is only one layer of sacrificial vias 148, the sacrificial vias 148 in this layer may also be referred to as perimeter vias 148. In further embodiments, L equals 2 or more. In this case, additional layers of sacrificial vias 148 surround the block via 149. The additional layers may cause additional stress relieving effect according to design considerations.

Figure 3A:
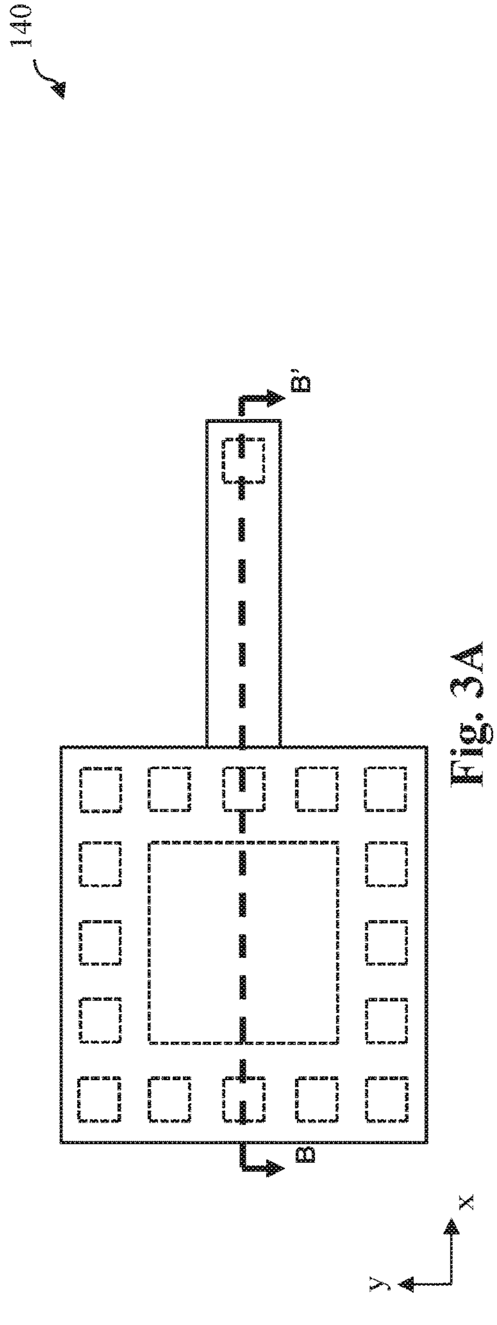
FIG. 3A illustrates the RDL structure of FIG. 1.
Figure 3B:
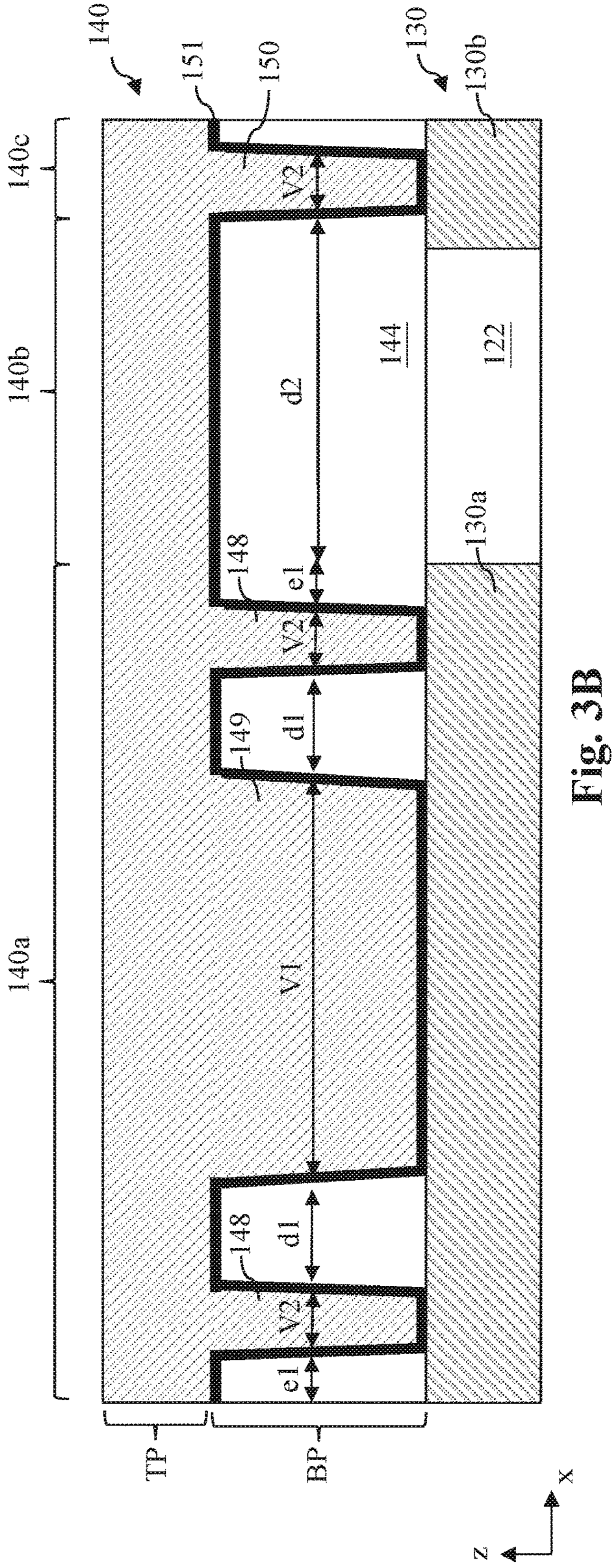
FIG. 3B illustrates a cross-sectional view cut along the line B-B' in FIG. 3A.

FIG. 3A illustrates the RDL structure 140 of FIG. 1, and FIG. 3B illustrates a cross-sectional view cut along the line B-B' in FIG. 3A. The same identifiers used in FIG. 1 equally apply to FIG. 3B. In this view, a top portion TP and a bottom portion BP of the RDL structure 140 is shown. The top portion TP extends laterally across the bond pad portion 140*a*, the connecting portion 140*b*, and the signal routing portion 140*c* along the x direction. Under the top portion TP is the bottom portion BP. The bottom portion BP includes all of the vias as part of the RDL structure 140 (i.e., sacrificial vias 148, block via 149, and the signal routing via 150). Note that the connecting portion 140*b* does not have a bottom portion BP because no vias are in this portion of the RDL structure 140. The vias of the RDL structure 140 are spaced away from each other by a passivation layer 144. In other words, the spacings e1, d1, and d2 are filled by different portions of the passivation layer 144. Each of the vias penetrate through the passivation layer 144 to land on structures below (e.g., top metal lines 130). In the embodiment shown, the block via 149 and the sacrificial vias 148 land on a top metal line 130*a*, and the signal routing via 150 lands on a top metal line 130*b*. The top metal line 130*a* and top metal line 130*b* may be separated by an interlayer dielectric (ILD) layer 122.

Still referring to FIG. 3B, the bond pad portion 140*a* is directly above the top metal line 130*a*, the connecting portion 140*b* is directly above the ILD layer 122, and the signal routing portion 140*c* is directly above the top metal line 130*b*. The top metal lines 130*a* and 130*b* may include copper or other suitable metal materials such as tungsten or cobalt. The ILD layer 122 may include silicon oxide, a silicon oxide containing material, or a low-K dielectric layer such as TEOS oxide, undoped silicate glass (USG), or doped silicon oxide such as BPSG, FSG, PSG, BSG, and/or other suitable low-K dielectric material. The RDL structure 140 and all its portions may include copper to form copper pads, copper vias, and copper lines. The passivation layer 144 may include silicon oxide, silicon nitride, or a suitable dielectric material.

Still referring to FIG. 3B, the RDL structure 140 may be lined with a conductive barrier layer 151 on bottom and side surfaces of each of the vias 148, 149, and 150. The conductive barrier layer 151 may also line a bottom surface of the top portion TP of the RDL structure 140. The conductive barrier layer 151 includes tantalum (Ta), tantalum nitride (TaN), titanium (Ti), titanium nitride (TiN), or a combination thereof. The RDL structure 140 having the conductive barrier layer 151 may be formed by a damascene process (e.g., dual-damascene fabrication process). For example, a passivation layer 144 may be deposited by a suitable deposition technology, such as CVD, high density plasma CVD (HDPCVD), other suitable technology or a combination thereof. Then, the passivation layer 144 is patterned in multiple steps to form via trenches (in bottom portion BP) and RDL trenches (in top portion TP). Then, the conductive barrier layer 151 is deposited conformally into the trenches by any suitable deposition techniques. Finally, a metal fill deposition fills both the via trenches and RDL trenches at the same time, thereby forming the RDL structure 140. The metal fill may be copper, and a planarization process such as CMP may be performed after the metal fill. As such, the RDL structure 140 has a uniform metal fill between the bottom portion BP (vias) and the top portion TP (metal pad and lines).

The bond pad portion 140*a* and the signal routing portion 140*c* have been described above to include both the top portion TP and the bottom portion BP. Other ways of describing the RDL structure RDL is possible without departing from the scope of the present disclosure. For example, the bond pad portion 140*a* may refer to only the top portion TP of the bond pad portion 140*a* and the signal routing portion 140*c* may refer to only the top portion TP of the signal routing portion 140*c*. In this case, the vias in the bottom portion BP may be referred to as bond pad vias or signal routing vias under the bond pad portion 140*a* and signal routing portion 140*c*, respectively. For another example, the bond pad portion 140*a* may refer to only the bottom portion BP of the bond pad portion 140*a* and the signal routing portion 140*c* may refer to only the bottom portion BP of the signal routing portion 140*c*. In this case, the top portion TP may be referred to as a RDL connecting portion that connects the bond pad portion 140*a* to the signal routing portion 140*c*.

Still referring to FIGS. 3A-3B, the top metal line 130*a* may have a bigger dimension in the x and y directions than the top metal line 130*b*. This is because the bond pad portion 140*a* of the RDL structure 140 is bigger than the signal routing portion 140*c* of the RDL structure 140. And to accommodate the difference in size, the dimensions of the respective top metal lines 130 are adjusted based on the via landing area.

Figure 4:
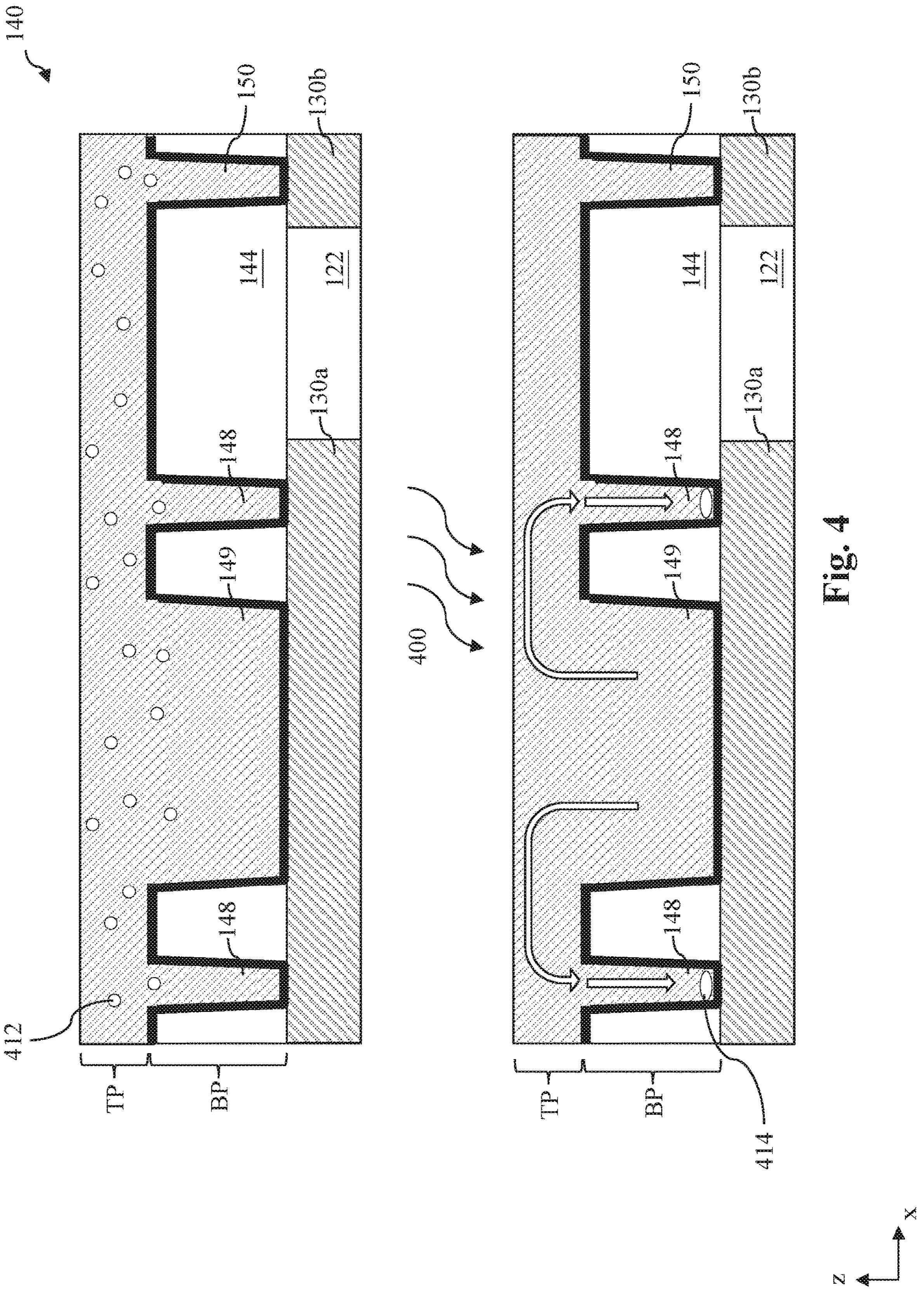
FIG. 4 illustrates a RDL structure detailing the stress-relieving mechanism of the present disclosure.

FIG. 4 illustrates a RDL structure 140 detailing the stress-relieving mechanism of the present disclosure. As shown, after the formation of the RDL structure 140, there may be vacancies 412 (or air voids) in the metal fill material (e.g., copper), and especially in the bulk portions (top portion TP and block via 149) of the RDL structure 140. It has been found that over time, exacerbated by electro or thermal stress, the vacancies 412 will migrate and nucleate from areas of high stress (bulk portions) to areas of low stress (thinner portions such as thin signal routing vias 150). Specifically, the vacancies 412 are affected by a stress gradient, which moves the vacancies from the top bulkier portion TP to the bottom less bulkier portions BP, resulting in the accumulation of vacancies at the bottom corner of the thinner vias (e.g., signal routing vias 150). Further, a pulling force from the larger block vias (e.g., block via 149) may also pull and cause vacancies or defects in the thinner vias (e.g., signal routing vias 150). These issues may cause a break leading to an open circuit between the signal routing via 150 and the top metal line 130*b*. Therefore, to solve these issues, sacrificial vias 148 are used to alleviate the defect and voiding that otherwise would have gone to the signal routing vias 150. To incorporate sacrificial vias 148 means that the block via 149 needs to be smaller, leaving space to form the sacrificial vias 148 given the dimension L1 or W1 described above. Having a smaller block via 149 results in a smaller pulling and stress effect on the signal routing via 150, which is desirable. This is because by reducing the metal volume of the block via 149, the source of vacancy and pull back stress is also reduced, improving the via hole bottom delamination issue.

Still referring to FIG. 4, a stress gradient event 400 occurs that causes the movement and migration of the vacancies 412. The stress gradient event 400 may be caused by the applying of voltage or current, the applying of heat or thermal treatment, or even just the passing of time. As shown, because of the sacrificial vias 148, the vacancy migration and pullback effect are alleviated or removed in the signal routing via 150. To that effect, the sacrificial vias 148 provides routes to release the stress, and the vacancy migration and pullback happens to the sacrificial vias 148 instead. This is made possible since the sacrificial vias 148 are closer to the block via 149 than the signal routing via 150. As such, the sacrificial vias 148 will attract the vacancies and pullback before the vacancies travel to the signal routing via 150. In other words, the stress defects issues are resolved in the bond pad portion 140*a* before it becomes a problem in the signal routing portion 140*c*. Additionally, or independently, because of the sacrificial via scheme that alleviates stress, any remaining vacancies in the signal routing portion 140*c* can be nucleated without excess stress effecting the bottom portion of the signal routing via 150. That is, after enough vacancies are accumulated in the sacrificial vias 148, stress is balanced so that no excess stress is affecting the signal routing via 150, avoiding or minimizing pullback break and voiding.

Still referring to FIG. 4, after the stress gradient event 400, the vacancies 412 will result in nucleated voids 414 in the sacrificial vias 148. In an embodiment, the nucleated voids 414 are only in the sacrificial vias 148 and not in the signal routing via 150. If there are any nucleated voids 414 in the signal routing via 150, they are inconsequential and do not cause pullback break. In an embodiment, there are more nucleated voids 414 in the sacrificial vias 148 than in the signal routing via 150.

Figure 5:
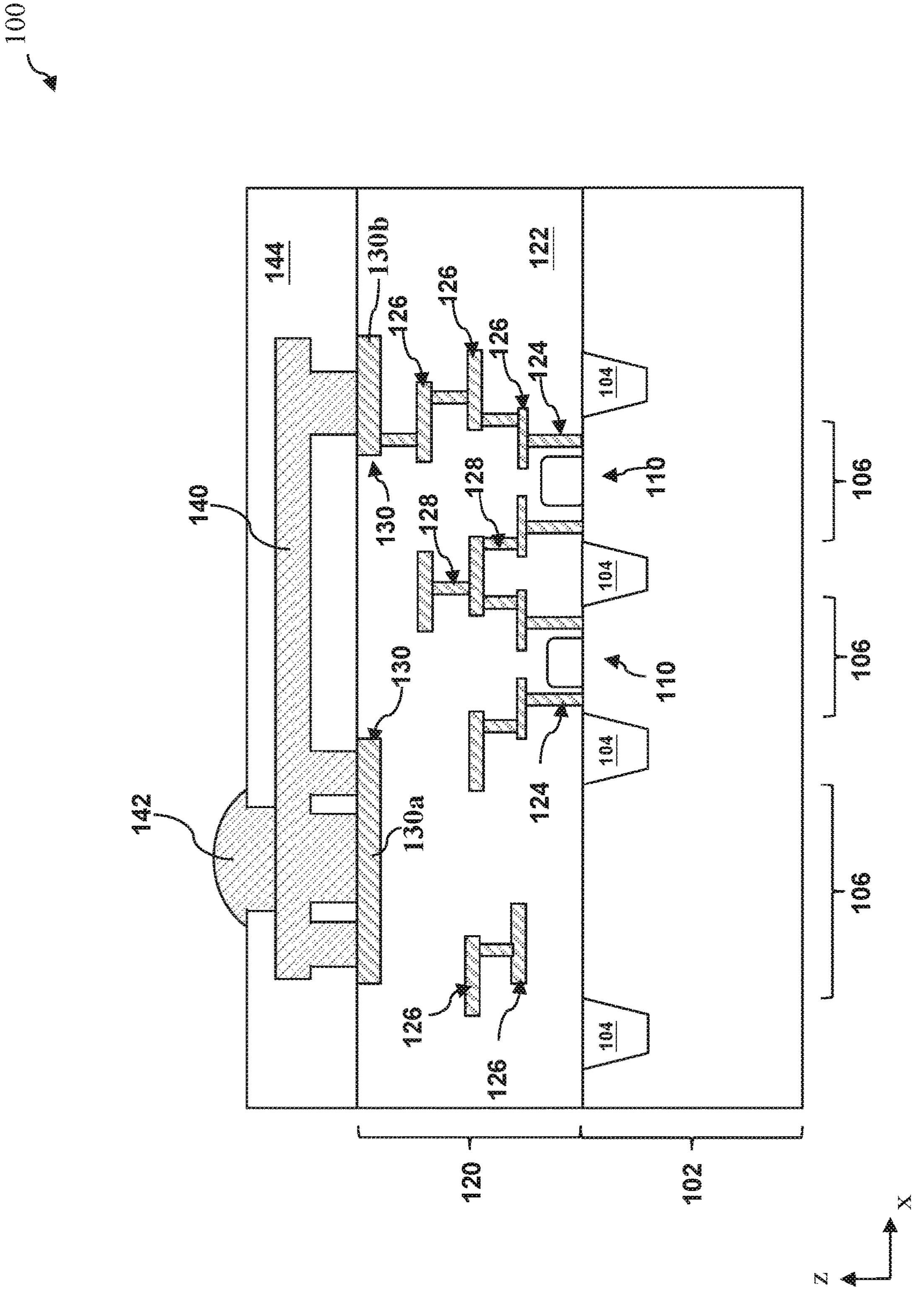
FIG. 5 illustrates an integrated circuit (IC) structure having a RDL structure according to an embodiment of the present disclosure.

FIG. 5 illustrates an integrated circuit (IC) structure 100 having a RDL structure 140 according to an embodiment of the present disclosure. The IC structure 100 includes a semiconductor substrate 102 having active regions 106 for forming transistor devices 110 such as logic devices, memory devices, or other types of devices. The active regions 106 include channel regions and source/drain regions. In an embodiment, the active regions 106 may be fin active regions protruding from the substrate 102. The substrate 102 includes a bulk silicon substrate. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features, such as isolation features 104 formed on or within the substrate 102 and defining the various active regions 106 on the substrate 102. The isolation feature 104 utilizes isolation technology, such as shallow trench isolation (STI), to define and electrically isolate the various active regions 106. The isolation feature 104 includes silicon oxide, silicon nitride, silicon oxynitride, other suitable dielectric materials, or combinations thereof. The isolation feature 104 is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The active regions 106 are regions with semiconductor surfaces wherein various doped features are formed and configured to one or more device, such as a diode, a transistor, and/or other suitable devices. The active region may include a semiconductor material similar to that (such as silicon) of the bulk semiconductor material of the substrate 102 or different semiconductor material, such as silicon germanium (SiGe), silicon carbide (SiC), or multiple semiconductor material layers (such as alternative silicon and silicon germanium layers) formed on the substrate 102 by epitaxial growth, for performance enhancement, such as strain effect to increase carrier mobility.

The IC structure 100 further includes an interconnection structure 120 formed on the semiconductor substrate 102. The interconnection structure 120 includes various conductive features to couple various transistor devices 110 into an integrated circuit. The interconnection structure 120 further includes an interlayer dielectric (ILD) layer 122 to separate and isolate various conductive features. For examples, the interconnection structure 120 includes contacts 124; metal lines 126; and vias 128. The metal lines 126 are distributed in multiple metal layers. In FIG. 5, four metal layers are illustrated. The top metal lines 130 are separately labeled with numerical 130. The contacts 124 provide vertical electrical routing from the semiconductor substrate 102 to the metal lines. The vias 128 provide vertical electrical routing between adjacent metal layers. Various conductive features are formed by one or more conductive material, such as metal, metal alloy, or silicide. For examples, the metal lines 126 may include copper, aluminum copper alloy, other suitable conductive material, or a combination thereof. The vias 128 may include copper, aluminum copper alloy, other suitable conductive material, or a combination thereof. The contacts 124 may include tungsten, silicide, nickel, cobalt, copper, other suitable conductive material, or a combination thereof. In some examples, various conductive features may further include a barrier layer, such as tantalum and tantalum nitride, titanium and titanium nitride. In the present embodiment, the top metal lines 130 includes copper or other suitable metal materials such as tungsten or cobalt.

As described previously with respect to FIG. 3B, the ILD layer 122 may include silicon oxide, a silicon oxide containing material, or a low-K dielectric layer such as TEOS oxide, undoped silicate glass (USG), or doped silicon oxide such as BPSG, FSG, PSG, BSG, and/or other suitable low-K dielectric material. The ILD layer 122 provides isolation functions to various device components (such as gates) and various conductive features (such as metal lines, contacts and vias). The formation of the ILD layer 122 includes deposition and CMP, for examples. The deposition may include spin-on coating, CVD, other suitable deposition technology or a combination thereof. The ILD layer 122 may include multiple layers and is collectively formed with various conductive features in a proper procedure, such as damascene process.

In some embodiments, the interconnection structure 120 or a portion thereof is formed by deposition and patterning. For examples, a metal (or metal alloy), such as copper or aluminum copper is deposited by physical vapor deposition (PVD), then is patterned by lithography process and etching. Then an ILD layer 122 is disposed on by deposition (and CMP). In some embodiments, the interconnect structure 120 uses a damascene process to form the metal lines 126, vias 128, and contacts 124.

Still referring to FIG. 5, the IC structure 100 includes a RDL structure 140 over the interconnection structure 120. The RDL structure 140 in FIG. 5 corresponds to the RDL structure 140 in FIGS. 1 and 3B. As such, the similar features will not be described again for the sake of brevity. In the embodiment shown, the bond pad portion 140*a* of the RDL structure 140 lands on the top metal line 130*a*, and the signal routing portion 140*c* of the RDL structure 140 lands on the top metal line 130*b*. The top metal line 130*a* acts as an etch stop layer for the bond pad portion 140*a* to land on. It is advantageous to have the top metal line 130*a* for level landing and more ideal formation of the block via and sacrificial vias 149 and 148. However, the top metal line 130*a* does not otherwise connect to any other conductive features. That is, the top metal line 130*a* is not routed to anywhere else but the RDL structure 140. As such, the bottom surface of the top metal line 130*a* is free of any vias 128 routing to the metal lines 126 below. On the other hand, the top metal line 130*b* is a signal routing top metal. The top metal line 130*b* connects to vias 128 and metal lines 126, routing all the way to the transistor devices 110 below. Because the top metal line 130*b* routes actual signal lines, the interface between the RDL structure 140 and the top metal line 130*b* (e.g., signal routing portion 140*c*) should not have any undesired pull-back and voiding as described above. On the other hand, since the top metal line 130*a* only acts as an etch stop and does not route any signals, it is ok to have voiding and pull-back in the interface between the RDL structure 140 and the top metal line 130*a* (e.g., bond pad portion 140*a*). Such voiding alleviates stress from the signal routing via 150 without affecting the connection between the bond pad portion 140*a* and the signal routing portion 140*c*.

Still referring to FIG. 5, the RDL structure 140 is embedded within the passivation layer 144. A bonding pad 142 may be formed in an opening of the passivation layer 144, where the opening is formed directly over the bonding pad portion 140*a* of the RDL structure 140. The passivation layer 144 is described with respect to FIG. 3B and may be multilayered (not shown) based on design considerations. The bonding pad 142 may have a similar composition as the RDL structure 140. The bonding pad 142 acts as a contact point for the IC structure 100 (e.g., for bonding to other IC structures or for IC testing such as probe testing).

Figure 6:
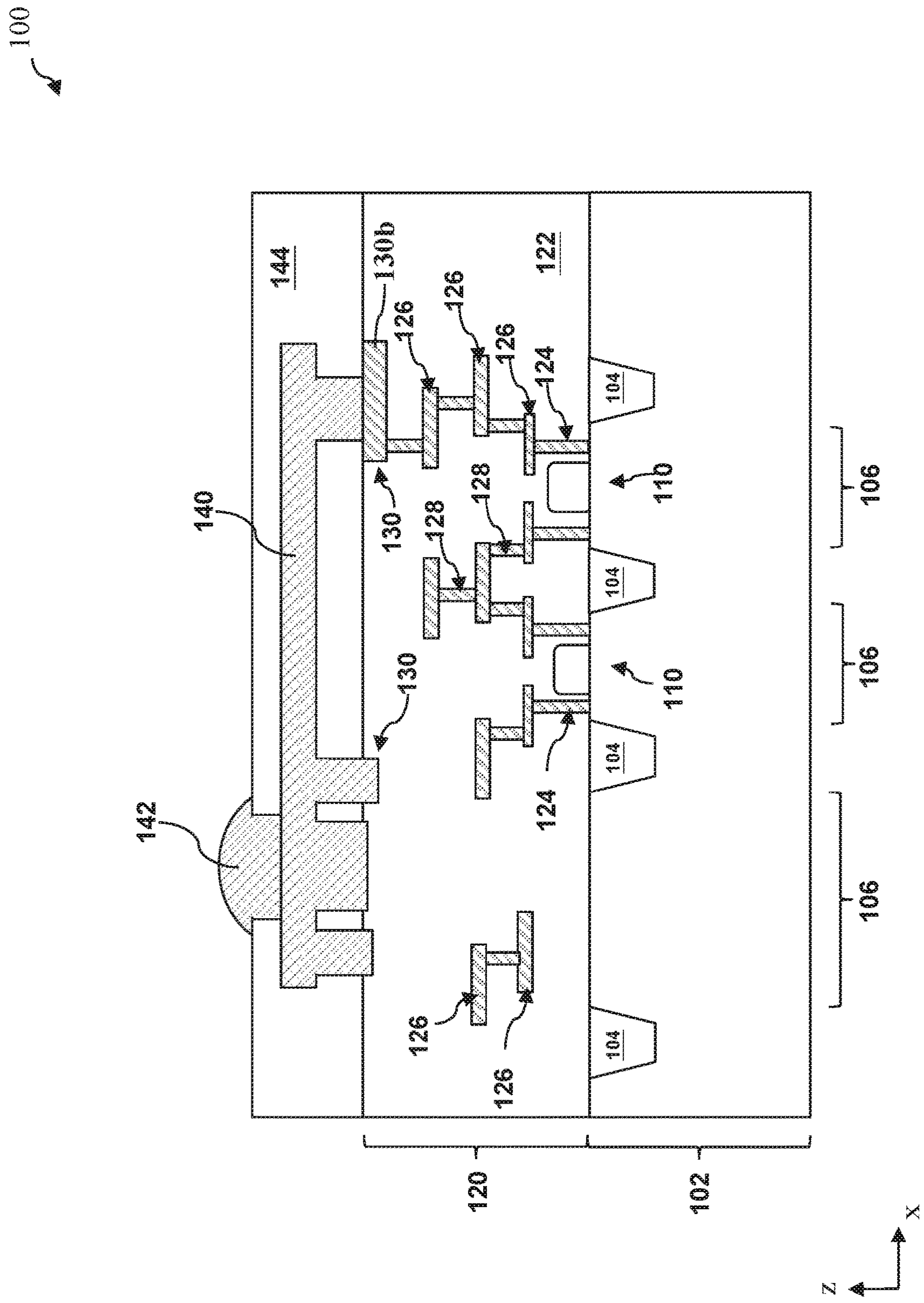
FIG. 6 illustrates an integrated circuit (IC) structure having a RDL structure according to another embodiment of the present disclosure.

FIG. 6 illustrates an integrated circuit (IC) structure 100 having a RDL structure 140 according to another embodiment of the present disclosure. The IC structure 100 in FIG. 6 is similar to the IC structure 100 in FIG. 5. The similar features will not be described again for the sake of brevity. The difference is that in FIG. 6, the top metal line 130*a* is not present in the interconnection structure 120. As described previously, the top metal line 130*a* acts as an etch stop layer and does not route any real signals from the transistor devices 110. As such, the top metal line 130*a* may be removed in some embodiments. However, as shown, the removal of the top metal line 130*a* may cause uneven over-etching when forming the block via 149 and the sacrificial vias 148. In these cases, the block via 149 and the sacrificial vias 148 may penetrate into a portion of the ILD layer 122. In other aspects, the stress-relieving mechanism of the present disclosure still applies.

Figure 7:
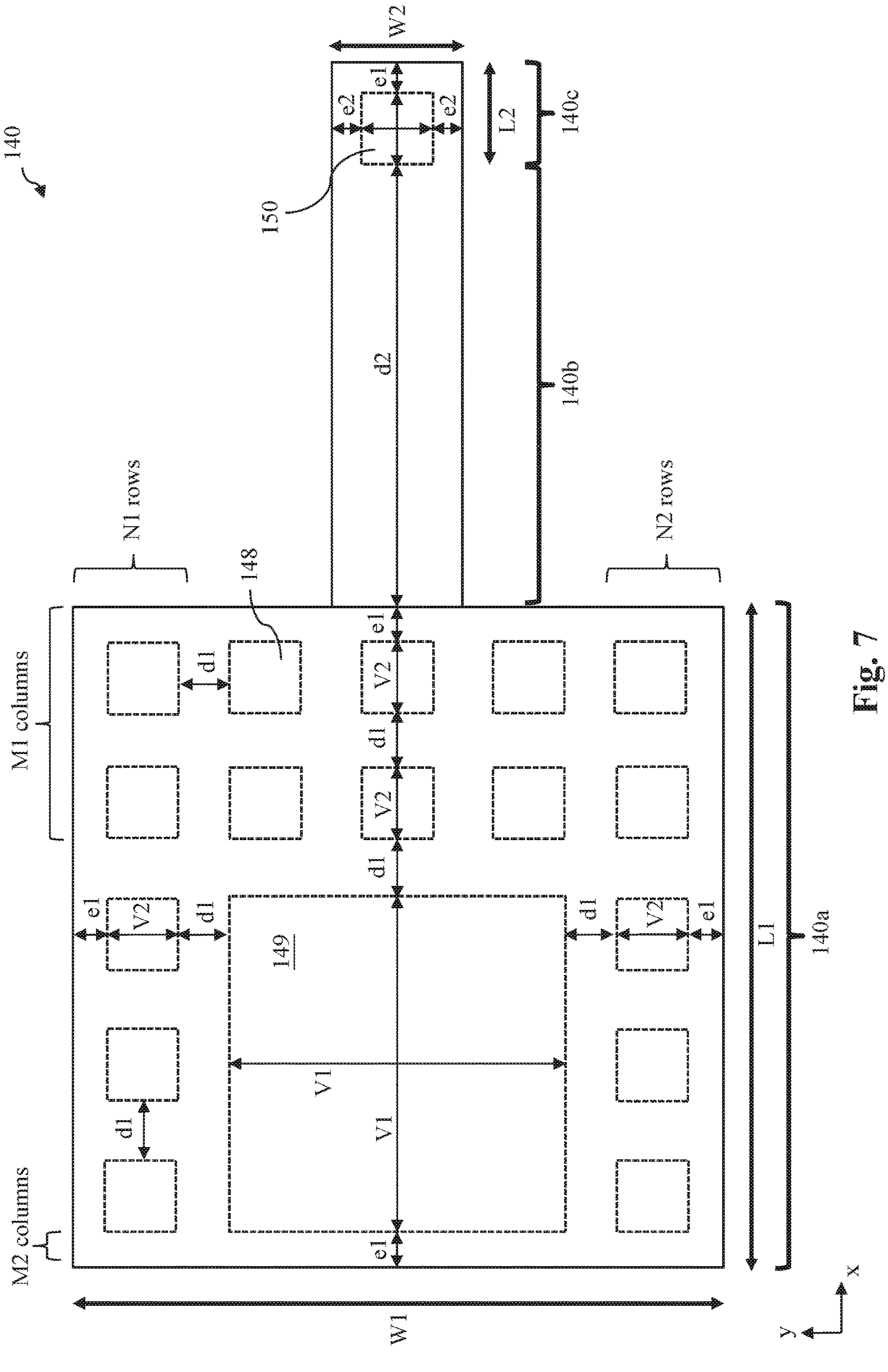
FIGS. 7-9 illustrate RDL structures having via arrays according to additional embodiment of the present disclosure.

FIG. 7 illustrates a RDL structure 140 having via arrays according to another embodiment of the present disclosure. FIG. 7 is similar to FIG. 1, and the similar features will not be described again for the sake of brevity. The difference here is the location of the block via 149. The block via 149 is moved further away from the signal routing via 150 to make space for another column of sacrificial vias 148. In this case, due to space restrictions, there are no columns of sacrificial vias 148 on the other side of the block via 149. As shown in this configuration, M1=2 and M2=0. Since there are two columns in the M1 columns, there is an extra buffer layer between the block via 149 and the signal routing via 150. This is an extra layer that traps and catches vacancies 412 before they travel toward and nucleate in the signal routing via 150. Even though the total amount of sacrificial vias 148 plus the block via 149 is the same as in FIG. 1, in some scenarios, having the extra in-between buffer layer such that M1=2 and M2=0 allows for more targeted stress relief than when M1=1 and M2=1 as in FIG. 1.

Figure 8:
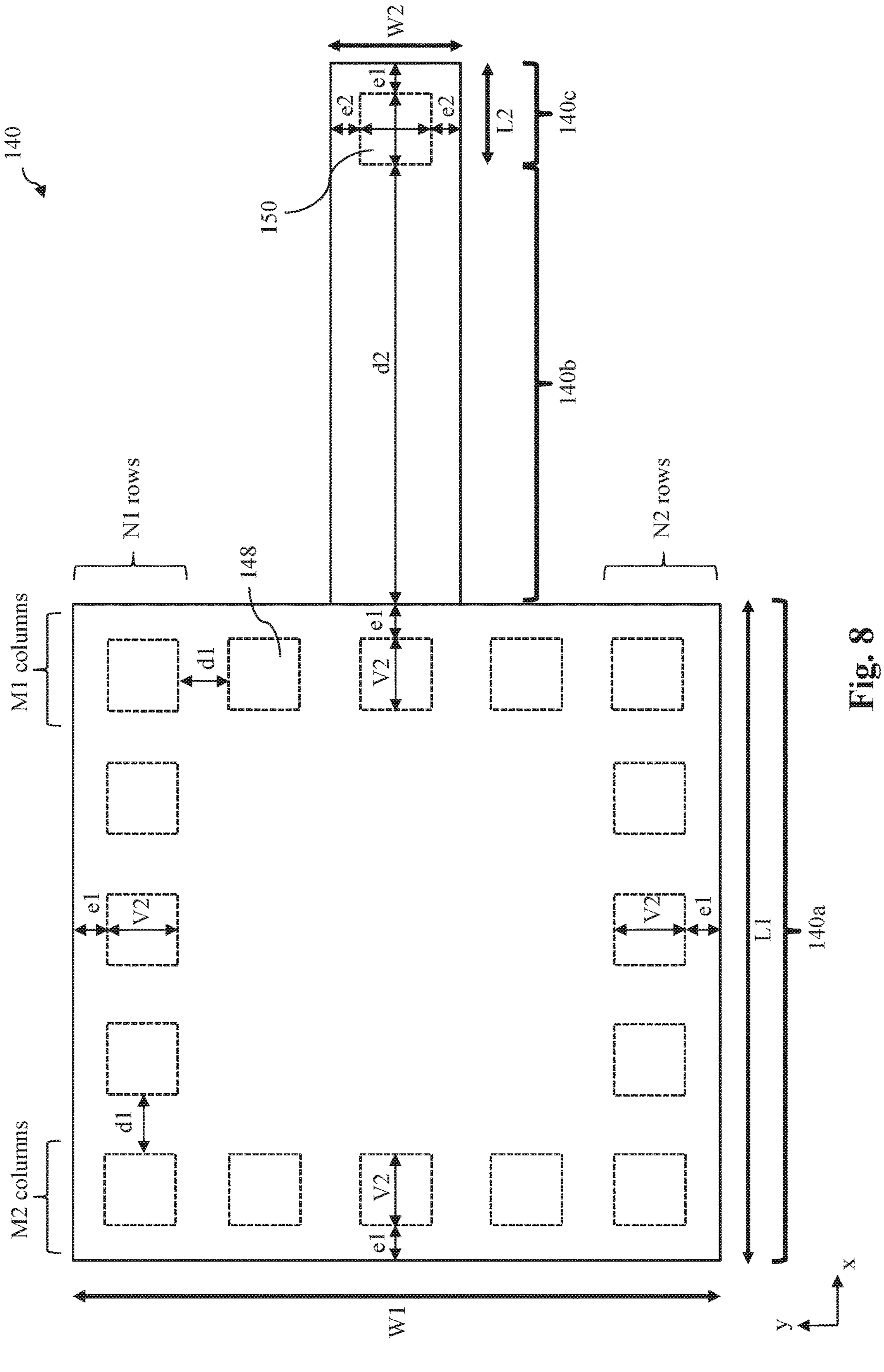

FIG. 8 illustrates a RDL structure 140 having via arrays according to another embodiment of the present disclosure. FIG. 8 is similar to FIG. 1, and the similar features will not be described again for the sake of brevity. The difference here is the removal of the block via 149. In this case, the bond pad portion 140*a* (or the bottom portion BP of the bond pad portion 140*a*) only includes the sacrificial vias 148. As such, the bulk metal stress effect is only coming from the top portion TP of the bond pad portion 140*a*, which is bigger in volume than the top portion TP of the connecting portion 140*b* and the top portion TP of the signal routing portion 140*c*. Therefore, the top portion TP of the bond pad portion 140*a* can still adversely affect the signal routing via 150 through voiding and pull-back effects. As such, the sacrificial vias 148 (or perimeter vias) still function to achieve the stress-relieving mechanism of the present disclosure.

Figure 9:
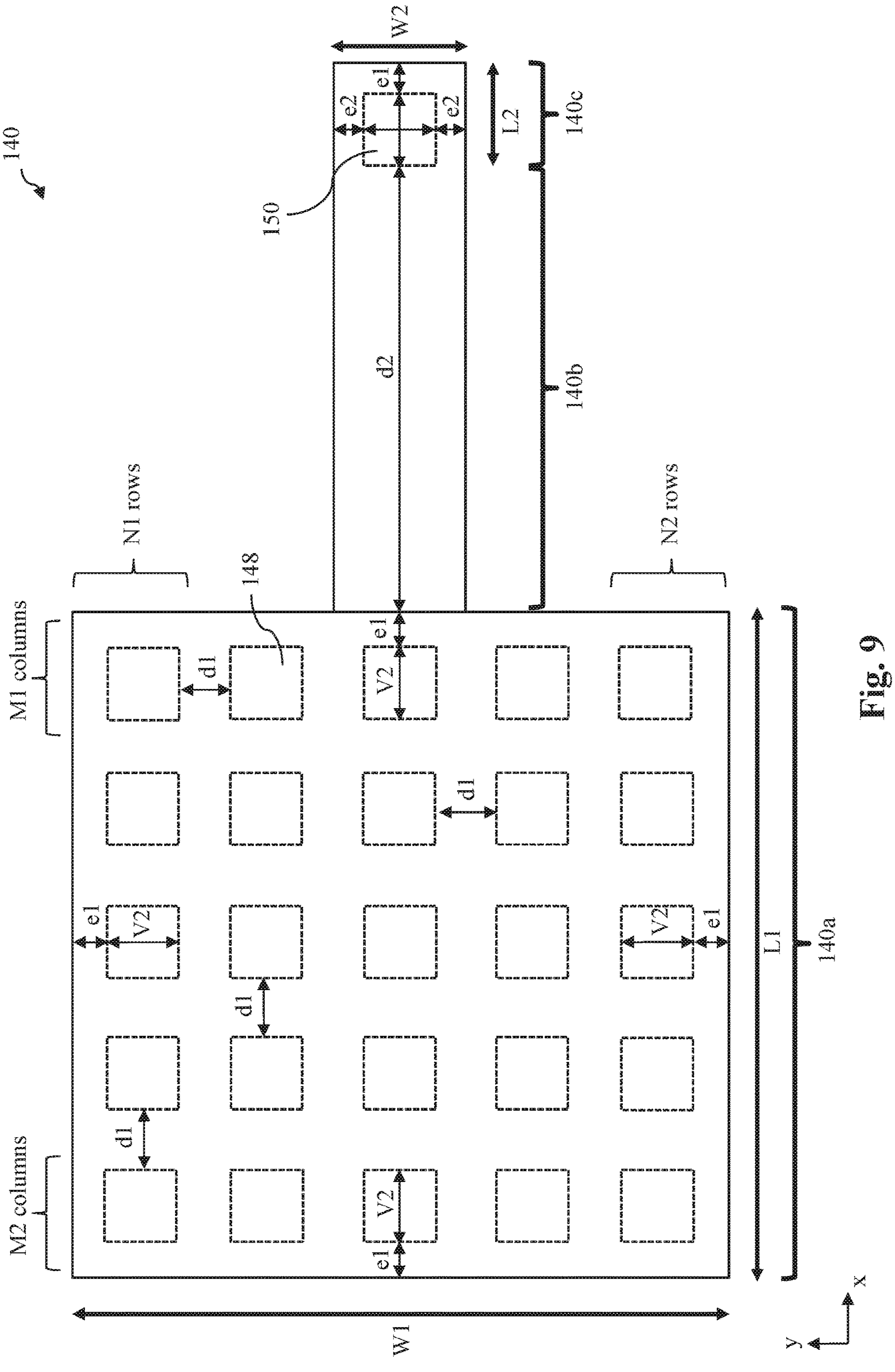

FIG. 9 illustrates a RDL structure 140 having via arrays according to another embodiment of the present disclosure. FIG. 2 is similar to FIG. 1, and the similar features will not be described again for the sake of brevity. The difference here is replacing the block via 149 with additional sacrificial vias 148. As such, perimeter sacrificial vias 148 surround center sacrificial vias 148. In this case, like in FIG. 8, the bond pad portion 140*a* (or the bottom portion BP of the bond pad portion 140*a*) only includes the sacrificial vias 148. As such, like in FIG. 8, the bulk metal stress effect is only coming from the top portion TP of the bond pad portion 140*a*, which is bigger in volume than the top portion TP of the connecting portion 140*b* and the top portion TP of the signal routing portion 140*c*. Therefore, the top portion TP of the bond pad portion 140*a* can still adversely affect the signal routing via 150 through voiding and pull-back effects. Like in FIG. 8, the sacrificial vias 148 still function to achieve the stress-relieving mechanism of the present disclosure, but here, additional sacrificial vias 148 are present for additional stress relief in different design applications.

Although not limiting, the present disclosure offers advantages for IC semiconductor structures that have redistribution layer (RDL) structures. One example advantage is incorporating sacrificial vias adjacent to bulk block vias, thereby alleviating stress and pull back effects that otherwise would impact the signal routing vias. Another example advantage is altering the location or even removing the bulk block via for further improvements to signal routing via to IC device connections. Another example advantage is incorporating a top metal line as a landing etch stop layer for the pad portion of the RDL structure.

One aspect of the present disclosure pertains to an integrated circuit (IC) structure. The IC structure includes a semiconductor substrate; an interconnect structure formed over the substrate; and a redistribution layer (RDL) structure formed over the interconnect structure, where the RDL structure includes: a RDL pad portion having a pad via array with multiple vias landing on a first top metal line of the interconnect structure; a RDL signal routing portion having a signal routing via landing on a second top metal line of the interconnect structure; and a RDL top portion over the RDL pad portion and the RDL signal routing portion, the RDL top portion connecting the RDL pad portion and the RDL signal routing portion together, where the multiple vias of the pad via array include a block via and an adjacent sacrificial via, the block via having a block via width along a first direction, the sacrificial via having a sacrificial via width along the first direction, and the block via width is greater than the sacrificial via width, where the sacrificial via is spaced closer to the block via than the signal routing via.

In an embodiment, a ratio of the block via width to the sacrificial via width is greater than 10.

In an embodiment, the RDL pad portion and the RDL signal routing portion are connected together through a connecting portion of the RDL top portion, and the connecting portion is directly above an interlayer dielectric (ILD) layer of the interconnect structure. In a further embodiment, the connecting portion of the RDL top portion has a line length along the first direction, and the line length is greater than 3 times the sacrificial via width. In a further embodiment, the line length is greater than a via spacing between the block via and the sacrificial via. In a further embodiment, a ratio of the line length to the via spacing is greater than 5.

In an embodiment, the RDL top portion directly over the first top metal line has a RDL pad area, the RDL pad area has a pad width along the first direction and a same pad width along a second direction perpendicular to the first direction. And the connecting portion of the RDL top portion has a RDL connecting area, the RDL connecting area has a line length along the first direction and a line width along the second direction. And the pad width is greater than the line width. In a further embodiment, a ratio of the pad width to the line width is in a range between 7 to 35.

In an embodiment, the sacrificial via is a first sacrificial via of a plurality of sacrificial vias, and the block via is surrounded by a layer of the plurality of sacrificial vias on each side of the block via. Each sacrificial via of the plurality of sacrificial vias are spaced apart from each other by a passivation layer.

In an embodiment, the sacrificial via is a first sacrificial via of a plurality of sacrificial vias, the block via is surrounded by a layer of the plurality of sacrificial vias on a first and a second side of the block via, the block via is surrounded by two layers of the plurality of sacrificial vias on a third side of the block via, and the block via is not surrounded by any layers of the plurality of sacrificial vias on a fourth side of the block via. The two layers of the plurality of sacrificial vias are disposed between the block via and the signal routing via, where each sacrificial via of the plurality of sacrificial vias are spaced apart from each other by a passivation layer.

Another aspect of the present disclosure pertains to an integrated circuit (IC) structure. The IC structure includes a semiconductor substrate; an interconnect structure formed over the substrate; and a redistribution layer (RDL) structure formed over the interconnect structure, where the RDL structure includes: a RDL pad portion having a pad via array with multiple vias landing on a first top metal line of the interconnect structure; a RDL signal routing portion having a signal routing via landing on a second top metal line of the interconnect structure; and a RDL top portion over the RDL pad portion and the RDL signal routing portion, the RDL top portion connecting the RDL pad portion and the RDL signal routing portion together, where the multiple vias of the pad via array includes perimeter vias disposed along edges of the RDL pad portion, where each of the perimeter vias are spaced closer to another one of the perimeter vias than to the signal routing via.

In an embodiment, the RDL pad portion and the RDL signal routing portion are connected together through a connecting portion of the RDL top portion, and the connecting portion is directly above an interlayer dielectric (ILD) layer of the interconnect structure. In a further embodiment, the RDL top portion directly over the first top metal line has a RDL pad area, the RDL pad area has a pad width along a first direction and a same pad width along a second direction perpendicular to the first direction. The connecting portion of the RDL top portion has a RDL connecting area, the RDL connecting area has a line length along the first direction and a line width along the second direction, where the pad width is greater than the line width by at least 7 times.

In an embodiment, the perimeter vias have substantially the same size. In a further embodiment, the multiple vias of the pad via array further include center vias surrounded by the perimeter vias, the center vias having substantially the same size as that of the perimeter vias. In a further embodiment, a spacing between adjacent center vias, between adjacent perimeter vias, and between a perimeter via and an adjacent center via is substantially the same.

Another aspect of the present disclosure pertains to an integrated circuit (IC) structure. The IC structure includes a semiconductor substrate; an interconnect structure formed over the substrate; and a redistribution layer (RDL) structure formed over the interconnect structure, where the RDL structure includes: a RDL pad portion having a pad via array with multiple vias landing on a first top metal line of the interconnect structure; a RDL signal routing portion having a signal routing via landing on a second top metal line of the interconnect structure; and a RDL top portion over the RDL pad portion and the RDL signal routing portion, the RDL top portion connecting the RDL pad portion and the RDL signal routing portion together. The integrated circuit also includes where the first top metal line has a first length along a first direction, the second top metal line has a second length along the first direction, and the first length is greater than the second length, where the first top metal line has a bottom surface free of contact from any metal features, and the second top metal line has a bottom surface in direct contact with a metal via routing to a semiconductor device of the substrate.

In an embodiment, the IC structure further includes a bonding pad landing on and directly above the RDL pad portion of the RDL structure.

In an embodiment, the IC structure further includes a passivation layer surrounding the RDL structure, where the RDL structure includes copper, and the passivation layer includes a dielectric material. In a further embodiment, the IC structure further includes a conductive barrier layer lining bottom and side surfaces of each of the multiple vias in the pad via array and the signal routing via, where the conductive barrier layer includes tantalum (Ta), tantalum nitride (TaN), titanium (Ti), titanium nitride (TiN), or a combination thereof The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) structure, comprising:

a semiconductor substrate;

an interconnect structure formed over the substrate; and a redistribution layer (RDL) structure formed over the interconnect structure, wherein the RDL structure includes:

a RDL pad portion having a pad via array with multiple vias landing on a first top metal line of the interconnect structure;

a RDL signal routing portion having a signal routing via landing on a second top metal line of the interconnect structure; and a RDL top portion over the RDL pad portion and the RDL signal routing portion, the RDL top portion connecting the RDL pad portion and the RDL signal routing portion together, wherein the multiple vias of the pad via array include a center block via surrounded by adjacent sacrificial vias, the block via having a block via width along a first direction and a block via length along a second direction different from the first direction, the sacrificial vias having a sacrificial via width along the first direction and a sacrificial via length along the second direction, wherein the block via width is greater than the sacrificial via width and the block via length is greater than the sacrificial via length, wherein the sacrificial via is spaced closer to the block via than the signal routing via.

2. The IC structure of claim 1, wherein a ratio of the block via width to the sacrificial via width is greater than 10.

3. The IC structure of claim 1, wherein the RDL pad portion and the RDL signal routing portion are connected together through a connecting portion of the RDL top portion, and the connecting portion is directly above an interlayer dielectric (ILD) layer of the interconnect structure.

4. The IC structure of claim 3, wherein the connecting portion of the RDL top portion has a line length along the first direction, and the line length is greater than 3 times the sacrificial via width.

5. The IC structure of claim 4, wherein the line length is greater than a via spacing between the block via and the sacrificial via.

6. The IC structure of claim 5, wherein a ratio of the line length to the via spacing is greater than 5.

7. The IC structure of claim 3, wherein the RDL top portion directly over the first top metal line has a RDL pad area, the RDL pad area has a pad width along the first direction and a same pad width along a second direction perpendicular to the first direction, wherein the connecting portion of the RDL top portion has a RDL connecting area, the RDL connecting area has a line length along the first direction and a line width along the second direction, wherein the pad width is greater than the line width.

8. The IC structure of claim 7, wherein a ratio of the pad width to the line width is in a range between 7 to 35.

9. The IC structure of claim 1, wherein the block via is surrounded by one layer of sacrificial vias on each side of the block via, wherein each sacrificial via of the layer of sacrificial vias are spaced apart from each other by a passivation layer.

10. The IC structure of claim 1, wherein the block via is surrounded by one layer of sacrificial vias on a first and a second side of the block via, the block via is surrounded by two layers of sacrificial vias on a third side of the block via, and the block via is not surrounded by any layers of sacrificial vias on a fourth side of the block via, wherein the two layers of the sacrificial vias are disposed between the block via and the signal routing via, wherein each sacrificial via is spaced apart from each other by a passivation layer.

11. An integrated circuit (IC) structure, comprising:

a semiconductor substrate;

an interconnect structure formed over the substrate; and a redistribution layer (RDL) structure formed over the interconnect structure, wherein the RDL structure includes:

a RDL pad portion having a pad via array with multiple vias landing on a first top metal line of the interconnect structure;

a RDL signal routing portion having a signal routing via landing on a second top metal line of the interconnect structure; and a RDL top portion over the RDL pad portion and the RDL signal routing portion, the RDL top portion connecting the RDL pad portion and the RDL signal routing portion together, wherein the multiple vias of the pad via array includes perimeter vias disposed along edges of the RDL pad portion and a center block via surrounded by the perimeter vias, wherein the center block via has a larger surface area than each of the perimeter vias, wherein each of the perimeter vias are spaced closer to another one of the perimeter vias than to the signal routing via.

12. The IC structure of claim 11, wherein the RDL pad portion and the RDL signal routing portion are connected together through a connecting portion of the RDL top portion, and the connecting portion is directly above an interlayer dielectric (ILD) layer of the interconnect structure.

13. The IC structure of claim 12, wherein the RDL top portion directly over the first top metal line has a RDL pad area, the RDL pad area has a pad width along a first direction and a same pad width along a second direction perpendicular to the first direction, wherein the connecting portion of the RDL top portion has a RDL connecting area, the RDL connecting area has a line length along the first direction and a line width along the second direction, wherein the pad width is greater than the line width by at least 7 times.

14. The IC structure of claim 11, wherein the perimeter vias have substantially the same size.

15. The IC structure of claim 11, wherein a spacing between adjacent perimeter vias and between the perimeter vias and the center block via is substantially the same.

16. The IC structure of claim 11, wherein the perimeter vias include nucleated voids absorbed from the center block via.

17. An integrated circuit (IC) structure, comprising:

a semiconductor substrate;

an interconnect structure formed over the substrate; and a redistribution layer (RDL) structure formed over the interconnect structure, wherein the RDL structure includes:

a RDL pad portion having a pad via array with multiple vias landing on a first top metal line of the interconnect structure, wherein the multiple vias include multiple smaller perimeter vias surrounding a bigger center via;

a RDL signal routing portion having a signal routing via landing on a second top metal line of the interconnect structure; and a RDL top portion over the RDL pad portion and the RDL signal routing portion, the RDL top portion connecting the RDL pad portion and the RDL signal routing portion together, wherein the first top metal line has a first length along a first direction, the second top metal line has a second length along the first direction, and the first length is greater than the second length, wherein the first top metal line has a bottom surface free of contact from any metal features, and the second top metal line has a bottom surface in direct contact with a metal via routing to a semiconductor device of the substrate.

18. The IC structure of claim 17, further comprising a bonding pad landing on and directly above the RDL pad portion of the RDL structure.

19. The IC structure of claim 17, further comprising a passivation layer surrounding the RDL structure, wherein the RDL structure includes copper, and the passivation layer includes a dielectric material.

20. The IC structure of claim 19, further comprising a conductive barrier layer lining bottom and side surfaces of each of the multiple vias in the pad via array and the signal routing via, wherein the conductive barrier layer includes tantalum (Ta), tantalum nitride (TaN), titanium (Ti), titanium nitride (TiN), or a combination thereof.

* * * * *